United States Patent [19]

Tults

[11] Patent Number: 4,823,387

[45] Date of Patent: Apr. 18, 1989

[54] TELEVISION TUNING SYSTEM WITH PROVISIONS FOR TUNING RF SIGNALS WITH SCRAMBLED VIDEO INFORMATION

[75] Inventor: Juri Tults, Indianapolis, Ind.

[73] Assignee: RCA Licensing Corporation, Princeton, N.J.

[21] Appl. No.: 47,848

[22] Filed: May 8, 1987

[51] Int. Cl.[4] .......................................... H04N 7/167
[52] U.S. Cl. .................................. 380/13; 358/193.1; 380/15; 455/164; 455/182
[58] Field of Search ................. 380/APS 13, APS 15; 455/164, 182; 358/193.1

[56] References Cited

U.S. PATENT DOCUMENTS

| | | | |
|---|---|---|---|
| 4,291,413 | 9/1981 | Henderson et al. | 455/182 |
| 4,295,165 | 10/1981 | Watanabe et al. | 358/193.1 |
| 4,405,947 | 9/1983 | Tults et al. | 358/193.1 |
| 4,408,225 | 10/1983 | Ensinger et al. | |
| 4,429,415 | 1/1984 | Chin et al. | 358/193.1 |
| 4,544,954 | 10/1985 | Chen | 358/193.1 |
| 4,603,349 | 7/1986 | Robbins | |

*Primary Examiner*—Stephen C. Buczinski
*Attorney, Agent, or Firm*—Eugene M. Whitacre; Thomas F. Lenihan; Peter M. Emanuel

[57] ABSTRACT

A tuning system for tuning non-standard frequency RF signals which utilizes searches for non-standard RF signals by examining both a synchronization component and an AFT signal at each of a successive number of search frequencies. If the AFT signal indicates the detection of a carrier, the frequency at which this occurs is stored. However, this frequency is not caused to be tuned unless the search has been completed and the synchronization signal has not indicated the presence of a carrier. Thus, the reliability afforded by the synchronization component is maintained while adding the capability for tuning scrambled channels.

3 Claims, 5 Drawing Sheets

TELEVISION TUNING SYSTEM WITH PROVISIONS FOR TUNING RF SIGNALS WITH SCRAMBLED VIDEO INFORMATION

FIELD OF THE INVENTION

The present invention concerns a tuning system for non-standard frequency RF television signals with scrambled video information.

BACKGROUND OF THE INVENTION

The growth of cable distribution networks has caused television manufacturers to provide television receivers with "cable-ready" or "cable-compatible" tuning systems. Cable distribution networks provide RF signals having carriers with non-standard frequencies which may be offset from respective standard broadcast frequencies. Accordingly, "cable-compatible" tuning systems must be capable of tuning such non-standard frequency RF signals. It is desirable that a "cable-compatible" tuning system be capable of tuning "pay" channels for which the video information is scrambled, usually by modifying a video synchronization component.

Tuning systems for non-standard frequency RF signals utilize searches in which the local oscillator frequency is changed in a range around the nominal local frequency for the selected channel and either one or both of an automatic fine tuning and a video synchronization signal is examined to determine when to terminate the search. One such system is disclosed in U.S. Pat. No. 4,405,947, entitled "Dual Search Mode Type Tuning System" issued in the names of J. Tults and M. P. French in September 1983.

If the non-standard frequency tuning provisions evaluate a synchronization component, scrambled channels may not be tunable. If only the AFT signal is utilized, while scrambled channels can be tuned, erroneous signals, such as sound carriers can be tuned.

SUMMARY OF THE PRESENT INVENTION

In accordance with the present invention, a tuning system utilizes searches for non-standard RF signals by examining both a synchronization component and an AFT signal at each of a successive number of search frequencies. If the AFT signal indicates the detection of a carrier, the frequency at which this occurs is stored. However, this frequency is not caused to be tuned unless the search has been completed and the synchronization signal has not indicated the presence of a carrier. Thus, the reliability afforded by the synchronization component is maintained while adding the capability for tuning scrambled channels.

DETAILED DESCRIPTION OF THE DRAWING

Figures 1, 1A:
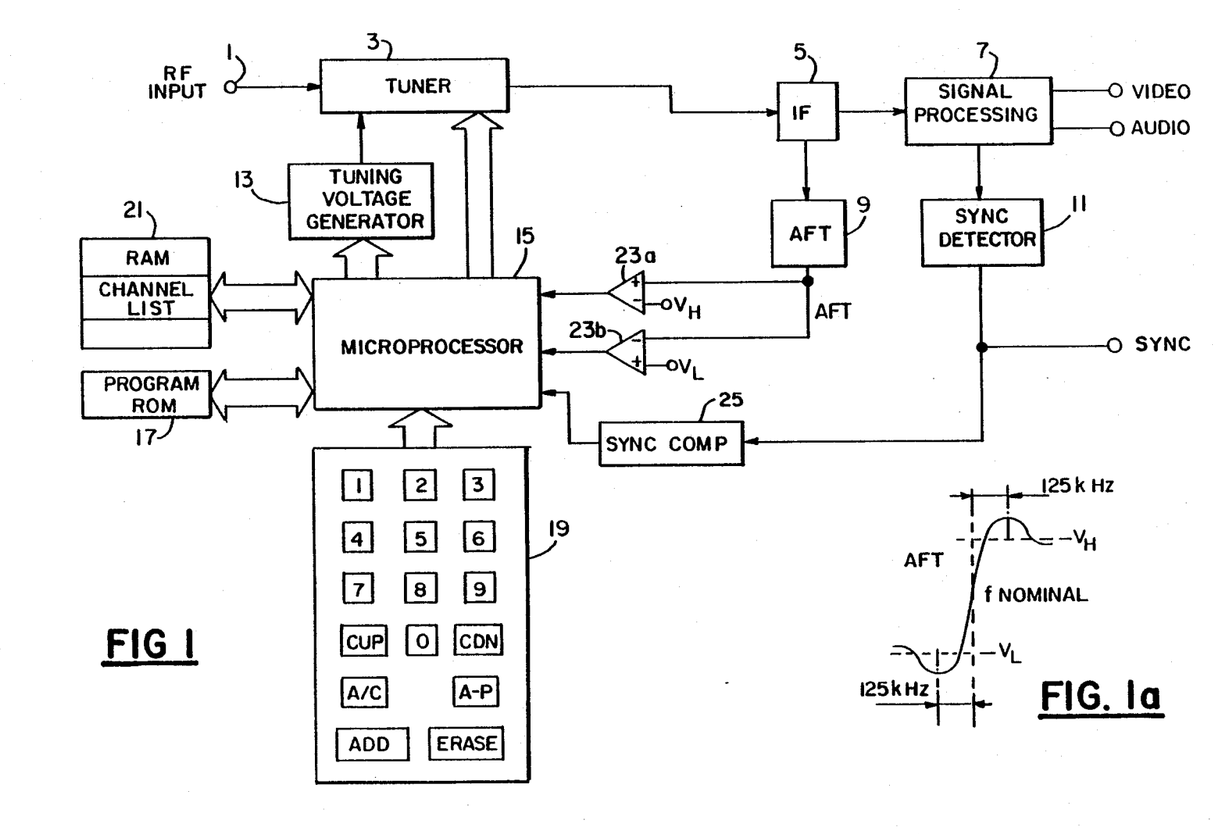
FIG. 1 shows, in block diagram form, a tuning system of a television receiver employing certain elements of the present invention.
FIG. 1a shows an AFT signal waveform useful in understanding an aspect of the tuning system shown in FIG. 1.

The television receiver shown in FIG. 1 includes an RF input 1 which may be connected either to a broadcast receiving antenna for receiving "off-the-air" RF signals associated with respective broadcast or "air" channels, to a cable distribution network for receiving RF signals associated with respective "cable" channels, or to a television accessory such as a video tape machine, video disc player, video camera, home computer or video game. RF input 1 is connected to a tuner 3. Sometimes, a television accessory such as a video disc machine or a video tape player is intended to be connected between the broadcast receiving antenna or cable distribution network and RF signal input 1 and includes a RF switching network for selectively providing either the RF signals from the connected one of the broadcast receiving antenna or the cable distribution network, or the RF signal from the television accessory to tuner 3.

Tuner 3 is capable of tuning either air channels or cable channels. Such tuners are well known in the art and are sometimes referred to as being "cable-ready" or "cable-compatible". Although not shown, as is well known, tuner 3 includes an RF stage and local oscillator responsive to band selection signals and to a tuning voltage for converting (heterodyning) the RF signal associated with a selected channel to a corresponding IF signal. The band selection signals determine the tuning configuration of the RF stage and the local oscillator according to the tuning band of the selected channel. The magnitude of the tuning voltage determines the RF signal selected by the RF stage and the frequency of the local oscillator.

The IF signal is processed in conventional fashion in an IF section 5 and coupled to a signal processing section 7. Signal processing section 7 demodulates the modulated picture and sound carriers of the IF signal to produce baseband video and audio signals at respective outputs.

An automatic fine tuning (AFT) signal representing the deviation, if any, of the frequency of the picture carrier of the IF signal from a nominal frequency value, e.g., 45.75 MHz in the United States, is generated by an AFT detector 9. The typical S-shaped waveform of the AFT signal is shown in FIG. 1a. The polarity of the AFT signal relative to an amplitude level corresponding to the nominal frequency represents the sense of the frequency deviation with respect to the nominal frequency and the amplitude of the AFT signal represents the magnitude of the frequency deviation. By way of example, in the present embodiment negative-going excursions below the amplitude level corresponding to the nominal frequency correspond to negative frequency deviations and positive-going excursions correspond to positive frequency deviations. The AFT signal is utilized in the tuning process as will be described below.

A composite synchronization ("sync") signal is derived from the video signal by a sync detector 11. In addition to its ordinary use of picture synchronization, the composite synchronization signal is also utilized in the tuning process as will also be explained below.

The tuning voltage for tuner 3 is generated by a tuning voltage generator 13 in response to a digital signal related to the selected channels. Tuning voltage generator 13 may be of the voltage synthesis type including a digital-to-analog converter or of the frequency synthesis type including a frequency or phase locked loop. In the preferred embodiment, tuning voltage generator 13 is of the frequency synthesis type because of the inherent accuracy and stability of the type of system. A suitable frequency synthesis type of tuning voltage generator including a phase locked loop (PLL) is described in U.S. Pat. No. 4,405,947 issued in the name of J. Tults and M. P. French. A suitable frequency synthesis type of tuning voltage generator including a frequency locked loop (FLL) is described in U.S. Pat. No. 4,485,404 issued in the name of J. Tults on Nov. 27, 1984. By way of example, it is assumed that a PLL tuning voltage generator is employed.

Briefly, a PLL tuning voltage generator includes a cascade of a fixed frequency divider (usually referred to as a "prescaler") for dividing the frequency of the local oscillator signal by a factor K and a programmable frequency divider for dividing the frequency of the output signal of the prescaler by a programmable factor N. A fixed frequency divider divides the frequency ($f_{XTAL}$) of the output signal of a crystal oscillator by a factor R to derive a reference frequency signal. A phase comparator compares the output signal of the programmable divider to the reference frequency signal to generate an "error" signal representing the phase and frequency deviations between the output signal of the programmable divider and the reference frequency signal. The error signal is filtered to produce the tuning voltage. The tuning voltage controls the frequency ($f_{LO}$) of the local oscillator until:

$$f_{LO} = \frac{NK}{R} f_{XTAL}$$

Thus, the frequency of the local oscillator signal can be controlled by controlling programmable factor N. If K, R and $f_{XTAL}$ are selected so that K/R $f_{XTAL}$ equals 1 MHz, N is equal in MHz, to the frequency of the local oscillator signal. Division factor N is controlled in response to the selected channels and to locate and tune non-standard frequency RF signals as will be explained below.

A microprocessor 15 generates a digital representation of the programmable factor N for controlling the frequency of the local oscillator signal and the band selection signals for tuner 3. Microprocessor 15 operates under the control of a computer program stored in a read-only-memory (ROM) 17. The portion of the program germane to the present invention is shown in flow chart form in FIG. 3. Microprocessor 15 responds to user command signals generated by a user control keyboard 19. Although keyboard 19 is shown directly connected to microprocessor 15 for simplicity, it may comprise the keyboard of a remote control unit.

Keyboard 19 includes keys for controlling various functions of the television receiver such as turning the receiver "on" and "off", controlling the volume level, and selecting channels to be tuned. Only the keys germane to channel selection are shown.

Digit keys (0-9) are provided for directly selecting a channel by entering the tens and units digits of the respective two digit channel number.

"Channel up" (CUP) and "channel down" (CDN) keys are provided for initiating a "channel scanning" mode of channel selection in which channels are successively tuned in increasing or decreasing frequency order until a channel in a list of active channels is located. Those channels not in the list will be automatically skipped over during the channel scanning mode. The list of active channels is stored in a non-volatile random access memory (RAM) 21 associated with microprocessor 15. RAM 21 includes a plurality of one-bit memory locations for respective channels. A logic "1" is stored in the memory locations for each active channel and a logic "0" is stored in the memory locations for each inactive channel. The memory locations are addressed in accordance with the channel number of the selected channel.

Keyboard 19 also includes an "air/cable" (A/C) key for selecting which of air or cable channels are to be tuned. A single-bit indication (e.g., a logic "1" for air channels and a logic "0" for cable channels) of whether air or cable channels are to be tuned is stored in RAM 21.

Keyboard 19 additionally includes an "auto-program" (A-P) key for initating an "auto-programming" mode for automatically "programming" the active channel list of RAM 21. During the auto-programming mode, all the channels are successively selected for tuning and at each channel it is determined, as described below, whether or not a valid RF television signal is present. A logic "1" is entered into the respective one-bit memory location of RAM 21 if a valid RF television signal is present and a logic "0" is entered if a valid RF television signal is not present.

The user may not want to receive all the active channels located during the auto-programming mode. On the other hand, the user may want tuning to stop at certain channels, such as channels used for a video cassette recorder, video game or home computer, which may not be continuously active or which may not be located for other reasons, as will be discussed below, during the auto-programming mode. For these reasons, keyboard 19 also includes "erase" and "add" keys for manually deleting and adding channels from the list stored in RAM 21. The digit keys may be used in conjunction with the "erase" and "add" keys to delete channels and to add channels to the list stored in RAM 21.

As earlier noted, RF input 1 may be connected to an air, a cable, or a television accessory RF signal source. The RF signals for air channels occupy low VHF, high VHF and UHF tuning bands and have carriers with standard frequencies assigned by the FCC. The RF signals for cable channels may also occupy the low VHF, high VHF and UHF bands and in addition may occupy mid, super, hyper and ultra bands interspersed with the low VHF, high VHF and UHF bands. The same channel numbers identify different air and cable channels. The RF signal produced by a television accessory is usually selectively available at one of two VHF channels, e.g., channels 3 and 4.

In view of the foregoing, the band selection signals for selecting the tuning configuration of the RF stage and local oscillator of tuner 3 are controlled in response, to the air/cable selection indication stored in RAM 21 as well as by the channel number of the selected channel. In addition, microprocessor 15 translates channel number of a channel selected for tuning to the appropriate division factor N and translates the channel numbers successively generated during the normal ("channel up" and "channel down") and auto-programming channel scanning and to the appropriate memory address for RAM 21 depending the air/cable selection indication.

The values of the division factor N for air channels with standard frequency RF signals are known in advance for every receiving location. Therefore the precise value of N for each air channel can be stored as part of the control program for microprocessor 15.

However, the values of division factor N for cable channels and television accessories with non-standard frequency RF signals which may be offset from respective standard frequencies are not known in advance for every receiving location. Therefore, the particular values of N for cable channels and television accessories cannot be stored in advance. Rather, when a cable distribution network or television accessory is connected to RF signal input 1, a search for the correct value of N is conducted for each channel to be tuned. During this search, the value of N is changed in steps in a range around the value of N for a respective standard frequency and, at each value of N, it is determined whether or not a valid television RF signal is present.

The searching provisions are desirable both in the normal tuning mode (in which channels are selected either directly with the tens and units digit keys or indirectly with the "channel up" and "channel down" keys) or during the auto-programming mode. It is recognized here that while the search should be as complete as possible to be able to tune almost any non-standard RF signal, the use of such complete searches, especially in the auto-programming mode tend to require an excessively long time. Some prior tuning systems have auto-programming provisions limited to locating only channels with standard frequency RF signals. While such limited auto-programming provisions are not time consuming, they will locate only active channels having carriers with non-standard frequencies at or very near respective standard frequencies. This is undesirable in view of the growing access to cable distribution networks providing a very large number of active channels.

Figure 2A:
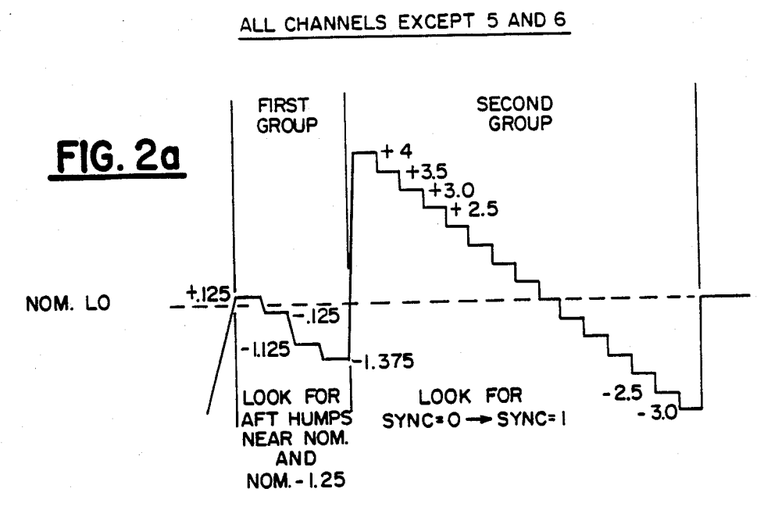
FIGS. 2a and 2b show waveforms indicating a tuning algorithm for the tuning system shown in FIG. 1.
Figure 2B:
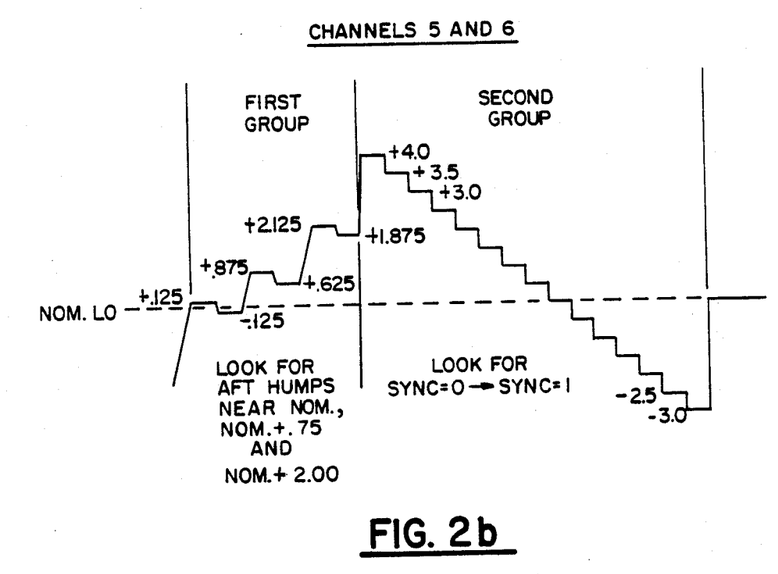

To shorten the time to tune non-standard frequency RF signals during the normal tuning mode or to locate them during the auto-programming mode, the present tuning system takes advantage of the recognition that while cable distribution networks provide RF signals having carriers with non-standard frequencies, the most commonly encountered non-standard frequencies can be categorized into a few groups of predictable frequencies. Specifically (as shown in FIGS. 2a and 2b), the tuning algorithm for searching for non-standard frequency RF signals is partitioned so that the presence of an RF signal is tested for initially of each at a first relatively small group of values of N corresponding to respective local oscillator search frequencies corresponding to predictable non-standard frequencies commonly encountered in cable distribution networks and thereafter at each of a second, relatively large, group of values of N corresponding to local oscillator search frequencies. The search algorithm is relatively quick because the most commonly encountered, and therefore most likely, non-standard RF signals are looked for first. During normal tuning modes, in which only a single channel is selected for tuning, both groups local oscillator search frequencies are utilized. However, during the auto-programming mode, in which all the channels are successively selected for tuning, only the first group is utilized.

The present tuning algorithm has been found to significantly reduce the time required for the auto-programming mode. While some active channels such as those corresponding to television accessories may not be located during the auto-programming mode, this is not a serious deficiency for several reasons. First, it is not likely that a television accessory would be activated during an auto-programming operation and therefore the associated channel would not be identified as being active by even the most complete search algorithm. Second, the channel associated with a television accessory will usually be known in advance and can be manually added to the list of active channels.

The present invention will now be more specifically described with reference to the cable distribution networks employed in the United States. The major cable distribution networks employed in the United States utilize one of the following three frequency allocation systems:

1. Standard Cable System—The frequencies of the picture carriers for channels 2 to 6 and 7 to 13 are at the FCC assigned broadcast (standard) frequencies. Additional channels are provided with carriers at 6 MHz intervals between 91.25 MHz and 169.25 MHz and between 217.25 MHz and 643.25 MHz.
2. HRC (Harmonical Related Carriers) System—The frequencies of the picture carriers of all the channels, except channels 5 and 6, have frequency offsets of 1.25 MHz lower than respective frequencies of the Standard Cable System. The frequencies of the carriers for channels 5 and 6 are 0.75 MHz higher than respective frequencies of the Standard Cable System.
3. IRC (Interval Related Carriers)—The frequencies of the carriers of all the channels, except channels 5 and 6, are not offset from respective frequencies of the Standard Cable System. The frequencies of the carriers for channels 5 and 6 are 2.0 MHz higher than respective frequencies of the Standard Cable System.

Accordingly, for use in the United States, for all channels selected for tuning, except channels 5 and 6, the first group of search frequencies correspond to:

1. The local oscillator frequency for the standard frequency (NOM) RF picture carrier; and
2. NOM—1.25 MHz For channels 5 and 6, the first group of search frequencies correspond to:

3. NOM;
4. NOM+0.75 MHz; and
5. NOM+2.0 MHz

Actually, as shown in FIGS. 2a and 2b, the search frequencies in the first group are pairs of frequency, each pair corresponding to one of the frequencies identified above. The reasons for the pairs stems from the use of the AFT signal to indicate the presence of valid RF television signals as will be explained below.

In the present tuning system, the presence of a valid RF television signal is determined by examining the conditions of the AFT and/or the composite sync signal. AFT comparators 23a and 23b and a sync comparator 25 coupled to microprocessor 15 are provided for this purpose.

The normal tuning mode for tuning a channel will be explained first. It is assumed that a cable network is connected to RF input 1 and that the air/cable key has been operated to place the tuning system in condition for tuning cable channels. During the following discussion, reference to FIGS. 2a and 2b and FIG. 3 should be made.

As shown in FIG. 1a, the AFT signal has a positive-going hump above a level $V_H$ with a peak at approximately 125 kHz above nominal frequency of the picture carrier and a negative-going hump below a level $V_L$ with a peak at approximately 125 kHz below nominal frequency f. The detection of the positive and negative-going humps by AFT comparators 23a and 23b, respectively, indicates the presence of a RF carrier for the selected channel. The order in which the humps are detected relative to the direction of frequency change is important in properly identifying the presence of a valid RF television signal. For the decreasing frequency direction of the local oscillator signal (and therefore of the IF signal) in the present, embodiment, the negative-going hump (indicating a positive frequency deviation) is encountered before the negative-going hump (indicating a positive frequency deviation). The reverse is true for the increasing frequency direction. The $V_H$ and $V_L$ threshold voltages applied to comparators 23a and 23b correspond to the $V_H$ and $V_L$ levels of the AFT signal defining the positive and negative-going humps as shown in FIG. 1a. Accordingly, during the search of the first group of local oscillator search frequencies, the values of division factor N are set to produce $\pm 125$ kHz pairs of frequencies with respect to the five local oscillator search frequencies identified above.

If both the positive-going and negative-going AFT humps are not detected by AFT comparators 23a and 23b at a particular value of N, N is changed to the next search value in the first group of search values. If both AFT humps have not been detected for any search value in the first group, it indicates that a valid RF television signal has not been found for the search values of the first group. In that case a so-called "sync edge" search utilizing the search values in the second group is initiated. The "sync edge" search will be explained below.

If both the AFT humps have been detected for a search value in the first group, the search is terminated and the composite synchronization signal is examined with sync comparator 25. The composite synchronization signal is examined because it is possible that the carrier detected by AFT comparators 23a and 23b may be a sound carrier rather than a picture carrier. A suitable sync validity detector which operates by measuring the frequency and pulse width of the pulses of the composite sync signal is described in the aforementioned Tults patent.

If the composite synchronization signal has the correct characteristics, the picture carrier of a RF television signal has been located and the search is terminated. However, the frequency of the local oscillator signal is adjusted for optimum tuning. That is, the frequency of the local oscillator signal is not left at the frequency at which the last (i.e., negative-going) hump was located since that last local oscillator frequency corresponds to an IF picture carrier frequency which removed from the nominal frequency. Rather the final frequency of the detected IF picture carrier is set between the two humps, and therefore much closer to the nominal IF picture carrier frequency, by setting the local oscillator frequency to the average of the frequencies at which the positive-going and negative-going humps were located. Thereafter, the frequency of the IF picture carrier is maintained between the two humps by comparing the amplitude of the AFT signal against threshold levels $V_L$ and $V_H$ and, if one of the two threshold levels is traversed, adjusting the frequency of the local oscillator signal in small steps, e.g., 31.25 kHz, in the opposite direction until the traversed one of the two threshold levels is again traversed.

If the composite synchronization signal does not have the correct conditions, it also indicates that the picture carrier of a RF television signal was not located for the first group of search frequencies. As in the case when the negative and positive-going humps are not detected, the "sync edge" search is initiated.

During the "sync edge" search, sync comparator 25 is used to examine the composite synchronization signal at each of the search frequencies of the second group. As shown in FIGS. 2a and 2b, in the present embodiment, this search occurs at 0.5 MHz steps and starts at a local oscillator frequency 4.0 MHz higher than the nominal frequency and ends at local oscillator frequency 3.0 MHz lower than the nominal frequency. The presence of a picture carrier of a RF television signal is indicated when a valid composite sync signal was not detected (indicated, e.g., by the generation of a logic "0" by composite sync detector 25) for the previous step and a valid composite sync signal is detected (a logic "1") for the present step. At that point, the local oscillator frequency corresponding to optimum tuning is no more than 0.5 MHz from the present step. The term "sync edge" corresponds to the transition from the invalid sync condition to the valid sync condition between steps. If the direction of search were reversed, the test for the location of a picture carrier would be a transition from a valid composite sync condition to an invalid sync condition.

The "sync edge" search is utilized because it more precisely locates the picture carrier than by merely determining when the composite synchronization signal is valid. This is so because the synchronization signal is valid for a very wide range (greater than 0.5 MHz) of local oscillator frequencies surrounding the local oscillator frequency corresponding to optimum tuning. Thus, utilizing sync comparator 25 alone (without regard to the transition between steps) could produce a local oscillator frequency considerably removed from the optimum value.

After the presence of the picture carrier of a valid RF signal has been located, the same operation used to maintain the frequency of the IF picture carrier between the AFT humps as previously discussed is utilized to optimize the tuning.

If an RF carrier is not located during the "sync edge" search, the nominal local oscillator frequency corresponding to the standard frequency RF signal for the selected channel is caused to be generated.

In the present tuning system, the search provisions are not defeated for air channels in order to be able to tune a non-standard frequency RF signal provided by a television accessory which is connected, in the manner described above, between a broadcast receiving antenna (which provides only standard frequency carriers) and the receiver. However, since the picture carrier will not likely be found for one of the predictable frequencies of the first group associated with cable channels, these frequencies are not examined for tuning air channels.

It is noted that if the AFT humps have been detected for the nominal local oscillator frequency for the selected channel and air channels have been selected for tuning, the validity of the composite sync is not examined if the AFT humps have been detected for the nominal local oscillator frequency. This is because, in this situation, it is very unlikely that the carrier will be a sound carrier.

The major difference between the auto-programming mode and the normal tuning mode is that only the first group of search frequencies are examined and the only test conducted is the one for the positive and negative-going AFT humps (i.e., the test for the validity of the composite synchronization signal is not conducted). If the two AFT humps have been detected for any search value for a channel selected to be tuned during the auto-programming mode, the channel is added to the list of active channels, otherwise, is deleted.

Another difference between the auto-programming mode and the normal tuning mode is that the composite synchronization signal is not examined in the auto-programming mode of the present embodiment to the goal of keeping the required time to a minimum. However, the tuning algorithm can be simply modified by changing the program for microprocessor 15 to add an examination of the composite synchronization signal to reduce the likelihood of erroneously adding a channel to the list of active channels due to the detection of positive and negative humps, e.g., in response to a sound carrier. However, this is not believed necessary for the predictable search frequencies.

The AFT signal is utilized to indicate the presence of a valid RF television signal during the search of the first group of search frequencies because the search in the first group is limited to a few predictable frequencies for which the presence of a valid RF television signal is likely to occur. The AFT signal indicates the location of a valid television signal in a range of frequencies around the nominal IF picture carrier frequency (e.g., +500 kHz and to −1 MHz) smaller than the range of frequencies (e.g., +500 kHz to −3.5 MHz) for which the composite synchronization signal indicates the presence of a valid RF television signal. Thus, if the composite synchronization signal were utilized without the sync edge, the location of a valid RF television signal could be indicated at a particular search frequency which is further from the optimum local oscillator frequency than that at which the AFT signal would indicate the location of a valid RF television signal. As a result, more than fine tuning might be required to locate the optimum local oscillator frequency, as indeed is the case if a valid RF television signal is located during the sync edge search as previously discussed.

In the present embodiment, the "sync edge" search utilizing the composite synchronization signal is utilized for the second group of search frequencies. The "sync edge" search has been found to very reliably indicate presence of the picture carrier of a RF television signal. However, it is believed that the search of the second group of frequencies may also be conducted by looking for the AFT humps. In this case the validity of the composite synchronization signal should be tested if the humps are detected to avoid the possibility of identifying a sound carrier as previously explained.

As is known, many of the channels of a cable distribution system provide RF signals with "scrambled" video components in which the horizontal synchronization component is suppressed, inverted or otherwise modified requiring a descrambler. Usually, the descrambler is located in a separate cable converter with its own tuner. Recently, it has been proposed that the tuner of the television receiver be utilized thereby eliminating the need for a tuner in the cable converter and also enabling the use of the remote control system of the television receiver to select channels. In this case, the receiver would be provided with input and output terminals for coupling the detected video signal to and from an external descrambler.

Since the search of the first group of frequencies involves the detection of the AFT humps but not the evaluation of the composite synchronization signal in the auto-programming mode, active "scrambled" cable channels having the predictable frequencies within the first group will be located in the auto-programming mode. However, active "scrambled" cable channels with other non-standard frequencies will not be located in the auto-programming mode since the evaluation of the composite synchronization signal is involved. In addition, active "scrambled" cable channels will not be tuned in the normal tuning mode due to the evaluation of the composite synchronization signal.

The tuning algorithm can be modified to eliminate the test for a valid composite synchronization signal after the detection of the AFT humps in the normal tuning mode so that "scrambled" cable channels with predictable frequencies in the first group can be tuned. However, this does not solve the problem of tuning "scrambled" cable channels with other non-standard frequencies.

Figure 3A:
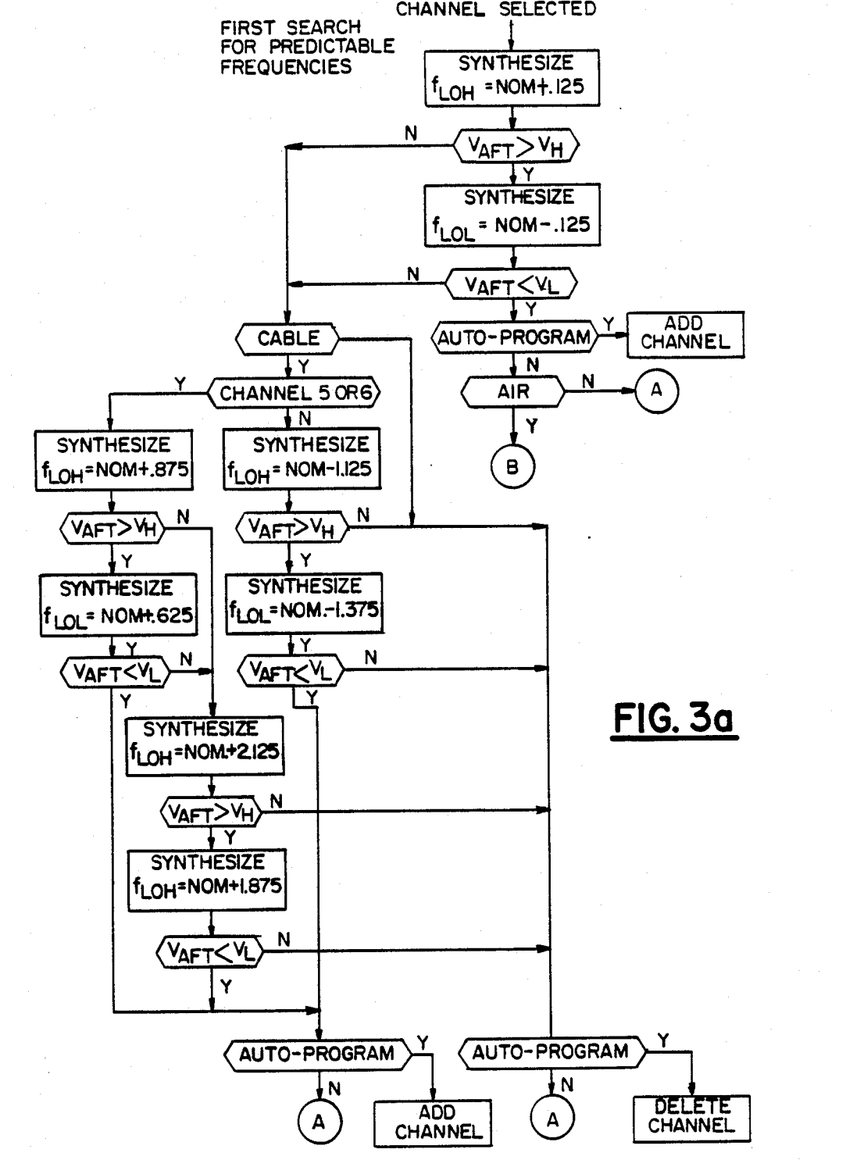
FIG. 3 shows a flow chart of a portion of the program for the microprocessor of the tuning system shown in FIG. 1 for establishing the tuning algorithm shown in FIGS. 2a and 2b.
Figure 3B:
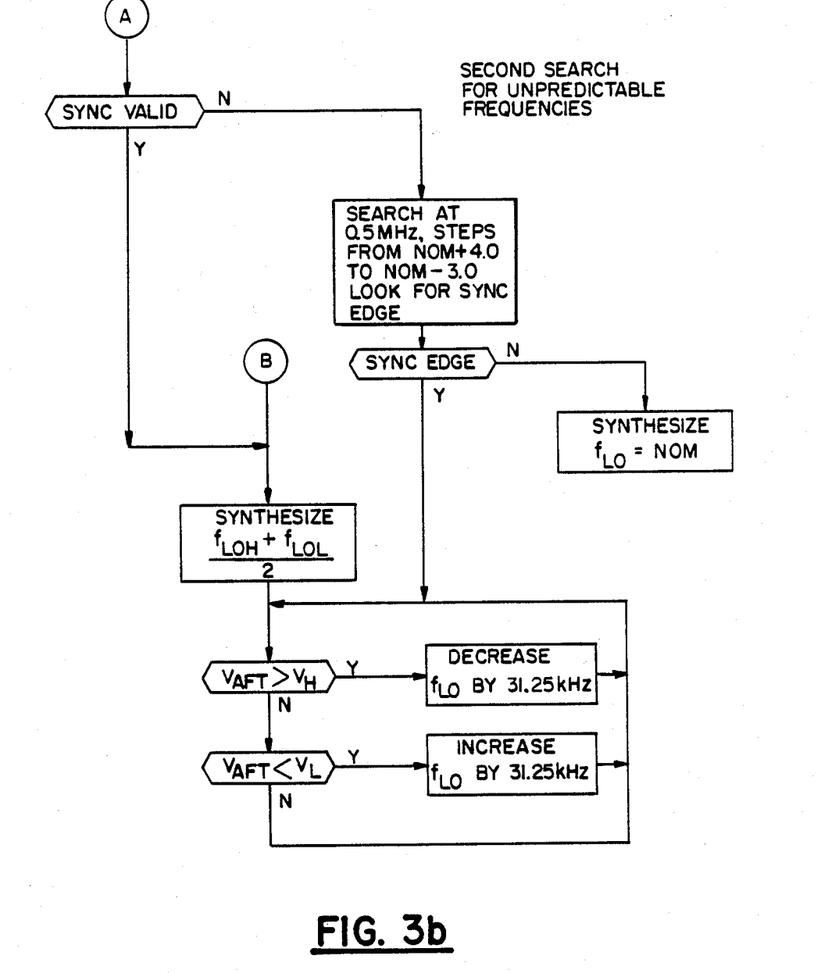
Figure 4:
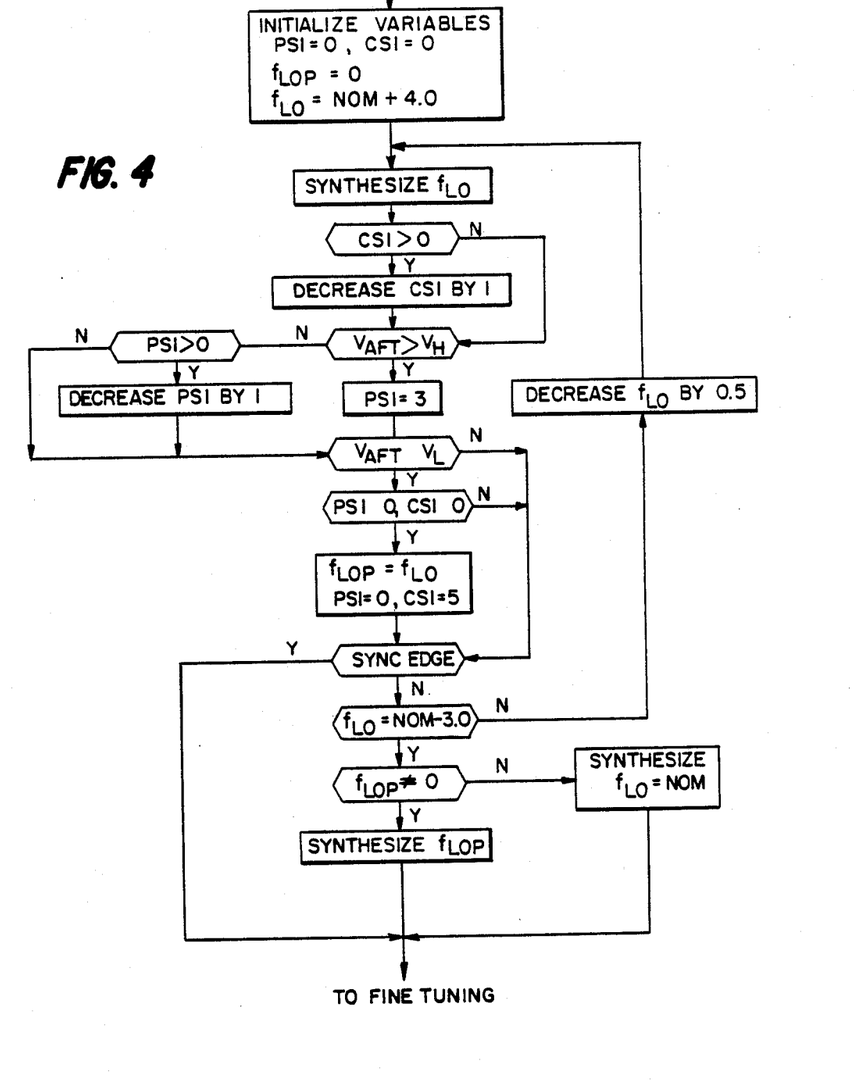
FIG. 4 shows a flow chart of a modification of the program shown in FIG. 3 in accordance with the present invention.

FIG. 4 shows a modification for the program shown in FIG. 3 to overcome the above problems resulting from "scrambled" cable channels. The modification is intended to replace the "sync edge" search portion of the program shown in FIG. 3 which utilizes only the composite synchronization signal. Basically, in addition to the "sync edge" test a test for a transition or cross-over from a positive-going AFT hump to a negative-going AFT hump is conducted for successive steps. More specifically, tests for positive and negative-going AFT humps are conducted at each 0.5 MHz step. The location of a picture carrier may be indicated by the detection of a positive-going hump at one step followed by the detection of a negative-going hump at the next step. (If the direction of search were reversed, then a negative-going hump followed by a positive-going hump could indicate the location of a picture carrier). The frequency at which the transition or the AFT cross-over from the detection of the positive-going hump to the negative-going hump (actually the frequency at which the negative-hump) is located is stored. However, the AFT cross-over frequency is not tuned until a complete search of the second group frequencies has been completed and it is determined that no "sync edge" transition from an invalid sync condition to a valid sync condition has occurred. The "sync edge" indication of a picture carrier is therefore given priority over the AFT cross-over indication of picture carrier. This is so because normal picture carriers are more likely to occur than scrambled picture carriers.

To ensure that positive-going hump and following negative-going hump correspond to the same carrier, a test is conducted to determine if the detected humps are separated by no more than 1 MHz (i.e., two steps). The variable PSI is used for this purpose. Note that a PSI value of 3 in the program corresponds to 1 MHz.

To reject the detection of the sound carrier of the lower adjacent channel, a test is conducted to determine if a second cross-over from a positive-going to a negative-going hump is detected at a frequency about 1.5 MHz after the frequency of a first cross-over. The variable CSI is used for this purpose. Note that a CSI value of 5 in program corresponds to at least 2 MHz.

If a cross-over from a positive-going to negative-going hump is detected and an invalid sync to valid sync transition has not been located after the complete search, the local oscillator frequency is set to frequency at which the negative-going hump was detected. Thereafter, as shown in FIG. 3, the local oscillator frequency is modified by 31.25 kHz steps until the local oscillator frequency is between the two humps.

It may be possible to eliminate the test concerning the separation between humps and/or the test for rejecting the sound carrier of the lower adjacent channel. In practice it has been found that the first of these tests may be readily eliminated.

While the present invention was described with respect to a preferred embodiment, several possible modifications were noted. These and other modifications, such as utilizing the horizontal synchronization component of the composite synchronization signal are contemplated to be within the scope of the invention defined by the following claims.

What is claimed is:

1. A tuning system for tuning channels with non-standard frequency radio frequency (RF) signals comprising:

local oscillator (LO) means for generating a (LO) signal;

mixer means for combining said (LO) signal with an RF signal having picture and sound carriers to produce an intermediate frequency (IF) signal having corresponding picture and sound carriers;

detector means for demodulating said picture carrier of said IF signal to produce a video signal having a synchronization component;

automatic fine tuning (AFT) means responsive to said IF signal for generating an AFT signal; and control means for changing the frequency of said LO signal during a search in a number of frequency steps in a predetermined sequence for each channel selected to be tuned; said control means evaluating both of said AFT signal and said synchronization component at each frequency step of said predetermined sequence to determine the presence of one of said carriers of said IF signal;

said control means including memory means for storing a frequency step at which said AFT signal indicates the presence of one of said carriers of said IF signal as the frequency of said LO signal continues to be changed during said search; said control means normally utilizing a frequency step at which said synchronization component indicates the presence of one of said carriers for tuning said selected channel, but utilizing said stored frequency step for tuning said selected channel if said search has been completed, whereby both of said AFT signal and said synchronization component have been evaluated at each frequency step of said predetermined sequence, and said synchronization signal has not indicated the presence of one of said carriers at any frequency step of said entire predetermined sequence.

2. The tuning system defined in claim 1 wherein:
said video signal is scrambled whereby said synchronization component is modified so that it does not correspond to a normal synchronization component.

3. A tuning system capable of tuning television channels with radio frequency (RF) signals having respective picture carriers which may have standard or non-standard frequencies and which may be modulated with video signals having standard or non-standard synchronization components comprising:

local oscillator (LO) means for generating a LO signal;

mixer means for combining said LO signal with one of said RF signals to produce an intermediate frequency (IF) signal having a picture carrier corresponding to the picture carrier of said one RF signal, said picture carrier of said IF signal having a nominal value;

detector means for demodulating said picture carrier of said IF signal to produce a detected video signal, including a synchronization component, corresponding to said one RF signal; and control means responsive to the frequency of said picture carrier of said IF signal and to said synchronization component of said detected video signal for controlling the frequency of said LO signal to tune a selected one of said channels by changing the frequency of said LO signal in a number of frequency steps in a predetermined sequence during a search in which at each frequency step of said predetermined sequence both the frequency of said picture carrier of said IF signal and said synchronization component of said detected video signal are evaluated; said control means including memory means for storing the frequency step of said LO signal at which the frequency of said picture carrier of said IF signal corresponds to said nominal value while the frequency of said LO signal continues to be changed during said search; said control means normally utilizing a frequency step at which said synchronization component of said detected video signal corresponds to said standard synchronization component to tune said selected channel and otherwise utilizing said stored frequency step at which the frequency of said picture carrier of said IF signal corresponds to said nominal value to tune said selected channel if said search has been completed, whereby both of the frequency of said picture carrier of said IF signal and said synchronization component have been evaluated at each frequency step of said predetermined sequence, but there was no frequency step of said entire predetermined sequence at which said synchronization component of said detected video signal corresponded to said standard synchronization component.

* * * * *

UNITED STATES PATENT AND TRADEMARK OFFICE
CERTIFICATE OF CORRECTION

PATENT NO. : 4,823,387

DATED : April 18, 1989

INVENTOR(S) : Juri Tults

It is certified that error appears in the above-identified patent and that said Letters Patent is hereby corrected as shown below:

Column 7, line 14, that portion reading "negative" should read -- positive --;
Column 7, line 17, that portion reading "positive" should read -- negative --.

Signed and Sealed this

Seventeenth Day of July, 1990

Attest:

*Attesting Officer*

HARRY F. MANBECK, JR.

*Commissioner of Patents and Trademarks*